(12) United States Patent
Watanabe et al.

(10) Patent No.: US 10,998,290 B2
(45) Date of Patent: May 4, 2021

(54) SEMICONDUCTOR DEVICE ASSEMBLIES WITH MOLDED SUPPORT SUBSTRATES

(71) Applicant: Micron Technology, Inc., Boise, ID (US)

(72) Inventors: Mitsuhisa Watanabe, Akita (JP); Fumitomo Watanabe, Akita (JP); Masanori Yoshida, Akita (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/243,995

(22) Filed: Jan. 9, 2019

(65) Prior Publication Data

US 2019/0148338 A1 May 16, 2019

Related U.S. Application Data

(63) Continuation of application No. 15/481,331, filed on Apr. 6, 2017, now Pat. No. 10,217,719.

(51) Int. Cl.
*H01L 25/00* (2006.01)
*H01L 25/065* (2006.01)
(Continued)

(52) U.S. Cl.
CPC ...... *H01L 25/0652* (2013.01); *H01L 23/5389* (2013.01); *H01L 24/19* (2013.01); *H01L 24/20* (2013.01); *H01L 24/96* (2013.01); *H01L 25/18* (2013.01); *H01L 25/50* (2013.01); *H01L 23/367* (2013.01); *H01L 23/49816* (2013.01); *H01L 2224/04105* (2013.01); *H01L 2224/06181* (2013.01); *H01L 2224/12105* (2013.01); *H01L 2224/13025* (2013.01); *H01L 2224/16146* (2013.01); *H01L 2224/16227* (2013.01); *H01L 2224/17181* (2013.01); *H01L 2224/2518* (2013.01); *H01L 2224/32225* (2013.01); *H01L 2224/73204* (2013.01);
(Continued)

(58) Field of Classification Search
CPC . H01L 23/3114; H01L 23/367; H01L 23/481; H01L 23/49838; H01L 23/5389; H01L 24/06; H01L 24/19; H01L 24/20; H01L 24/96; H01L 25/0652; H01L 25/0657; H01L 25/18; H01L 25/50
See application file for complete search history.

(56) References Cited

U.S. PATENT DOCUMENTS

2015/0001731 A1* 1/2015 Shuto ............... H01L 24/19
257/774
2015/0380388 A1* 12/2015 Yu .................. H01L 23/481
257/737
(Continued)

*Primary Examiner* — Cuong Q Nguyen
(74) *Attorney, Agent, or Firm* — Perkins Coie LLP

(57) ABSTRACT

Semiconductor device assemblies with molded support substrates and associated methods are disclosed herein. In one embodiment, a semiconductor device assembly includes a support substrate, a first semiconductor die embedded within the support substrate, a second semiconductor die coupled to the support substrate, and a third semiconductor die coupled to the support substrate. The assembly can also include a redistribution network formed on a first and/or second side of the support substrate, and a plurality of conductive contacts electrically coupled to at least one of the first, second or third semiconductor dies.

20 Claims, 8 Drawing Sheets

(51) Int. Cl.
*H01L 25/18* (2006.01)
*H01L 23/538* (2006.01)
*H01L 23/00* (2006.01)
H01L 23/498 (2006.01)
H01L 23/367 (2006.01)

(52) U.S. Cl.
CPC ............ *H01L 2224/92125* (2013.01); *H01L 2225/06513* (2013.01); *H01L 2225/06517* (2013.01); *H01L 2225/06541* (2013.01); *H01L 2225/06555* (2013.01); *H01L 2225/06565* (2013.01); *H01L 2225/06572* (2013.01); *H01L 2225/06582* (2013.01); *H01L 2225/06589* (2013.01); *H01L 2924/10253* (2013.01); *H01L 2924/10329* (2013.01); *H01L 2924/14* (2013.01); *H01L 2924/1431* (2013.01); *H01L 2924/1434* (2013.01); *H01L 2924/1436* (2013.01); *H01L 2924/1437* (2013.01); *H01L 2924/15311* (2013.01)

(56) References Cited

U.S. PATENT DOCUMENTS

| | | | |
|---|---|---|---|
| 2016/0085899 A1* | 3/2016 | Qian | H01L 23/5384 257/774 |
| 2016/0260684 A1* | 9/2016 | Zhai | H01L 25/0652 |
| 2017/0133351 A1* | 5/2017 | Su | H01L 24/19 |
| 2017/0345761 A1 | 11/2017 | Yu et al. | |
| 2018/0226364 A1* | 8/2018 | Kim | H01L 23/49827 |

* cited by examiner

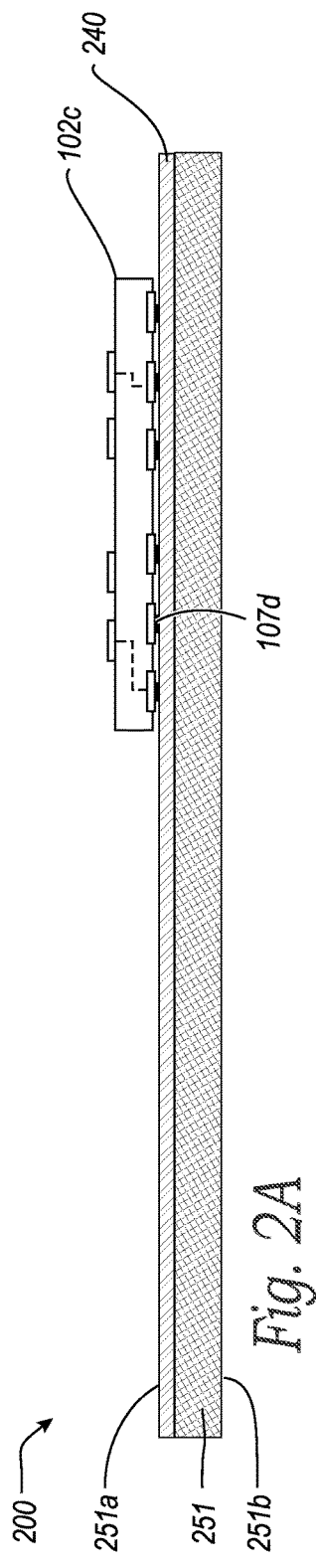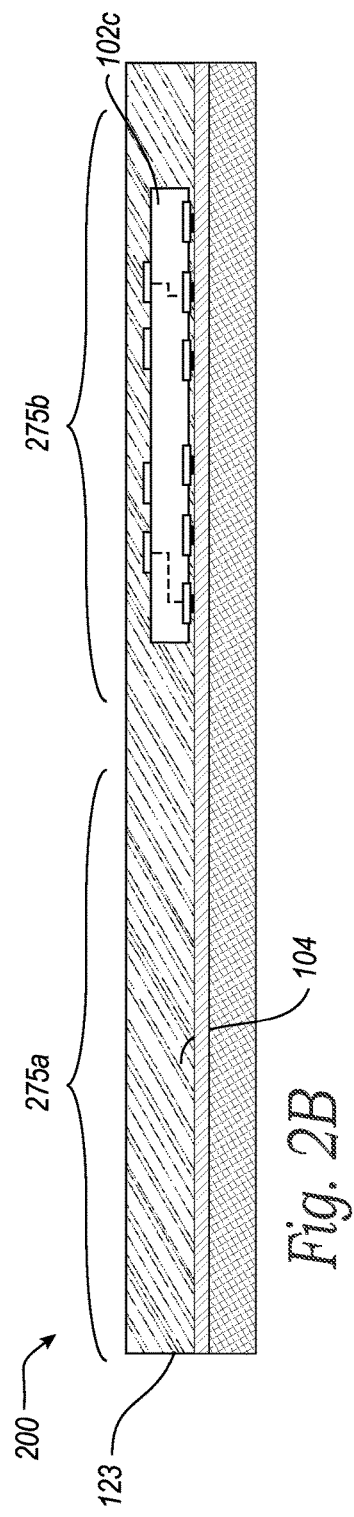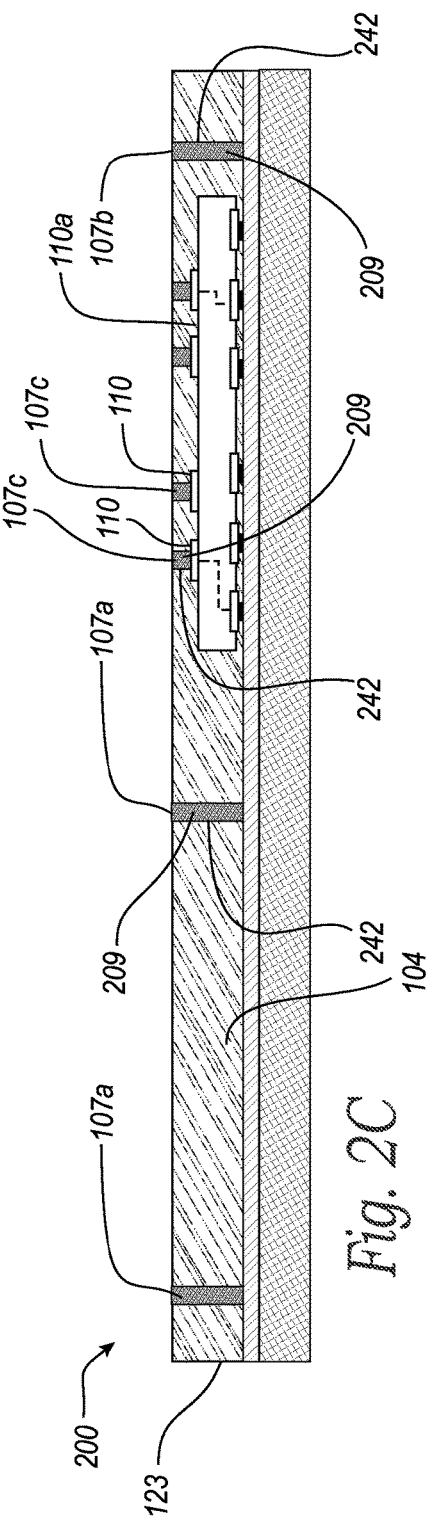

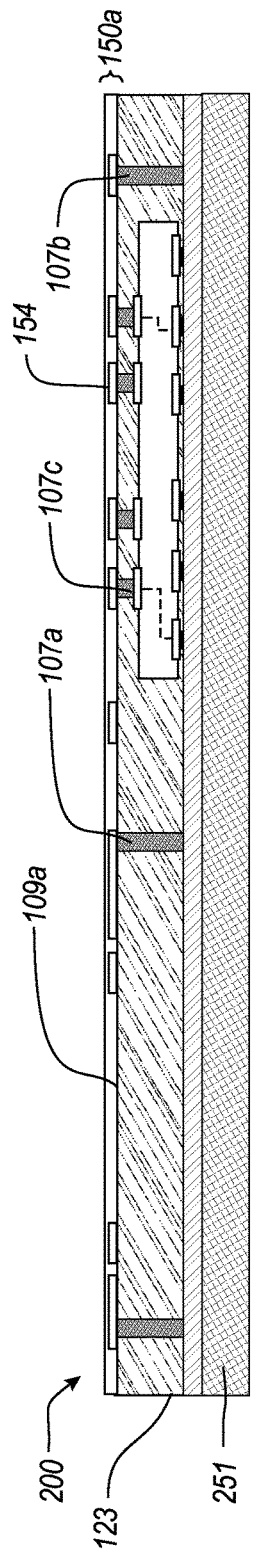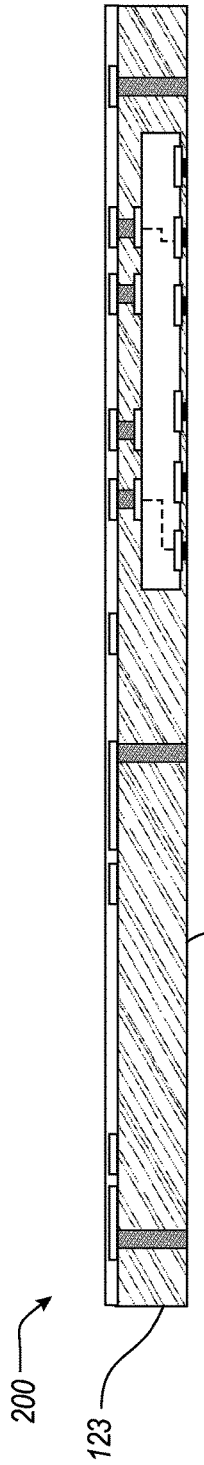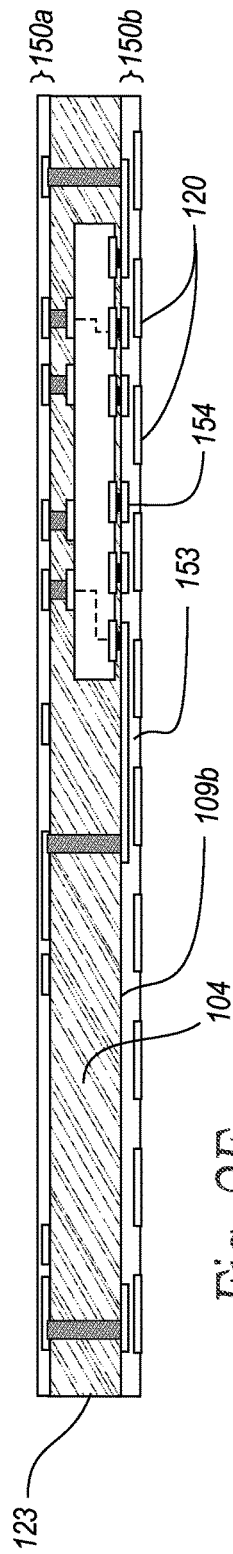

SEMICONDUCTOR DEVICE ASSEMBLIES WITH MOLDED SUPPORT SUBSTRATES

CROSS-REFERENCE TO RELATED APPLICATIONS

This application is a continuation of U.S. application Ser. No. 15/481,331, filed Apr. 6, 2017, which is incorporated herein by reference in its entirety.

TECHNICAL FIELD

The disclosed embodiments relate to semiconductor device assemblies with support substrates formed from a molded material.

BACKGROUND

Packaged semiconductor dies, including memory dies, microprocessor dies, and interface dies, typically include a semiconductor die mounted on a substrate and encased in a plastic protective covering. The die includes functional features, such as memory cells, processor circuits, and interconnecting circuitry, as well as bond pads electrically connected to the functional features. The bond pads are often electrically connected to external terminals that extend outside of the protective covering to allow the die to be connected to busses, circuits or other higher level circuitry.

Semiconductor die manufacturers are under increasing pressure to continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. Stacking multiple dies, however, increases the vertical profile of the device, requiring the individual dies to be thinned substantially to achieve a vertically compact size.

BRIEF DESCRIPTION OF THE DRAWINGS

FIGS. 2A-2G are cross-sectional views illustrating a semiconductor device at various stages of manufacturing a semiconductor device assembly in accordance with embodiments of the present technology.

DETAILED DESCRIPTION

Embodiments of semiconductor device assemblies with support substrates formed from a mold material are described below. In some embodiments, a semiconductor device assembly includes a semiconductor die and a mold material that together form a die substrate or similar support structure upon which additional dies of an assembly can be stacked. The term "semiconductor device" generally refers to a solid-state device that includes semiconductor material. A semiconductor device can include, for example, a semiconductor substrate, wafer, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing.

The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form.

The term "semiconductor die" generally refers to a die having integrated circuits or components, data storage elements, processing components, and/or other features manufactured on semiconductor substrates. For example, semiconductor dies can include integrated circuit memory and/or logic circuitry. A person skilled in the relevant art will also understand that the technology may have additional embodiments, and that the technology may be practiced without several of the details of the embodiments described below with reference to FIGS. 1-6.

Figure 1:
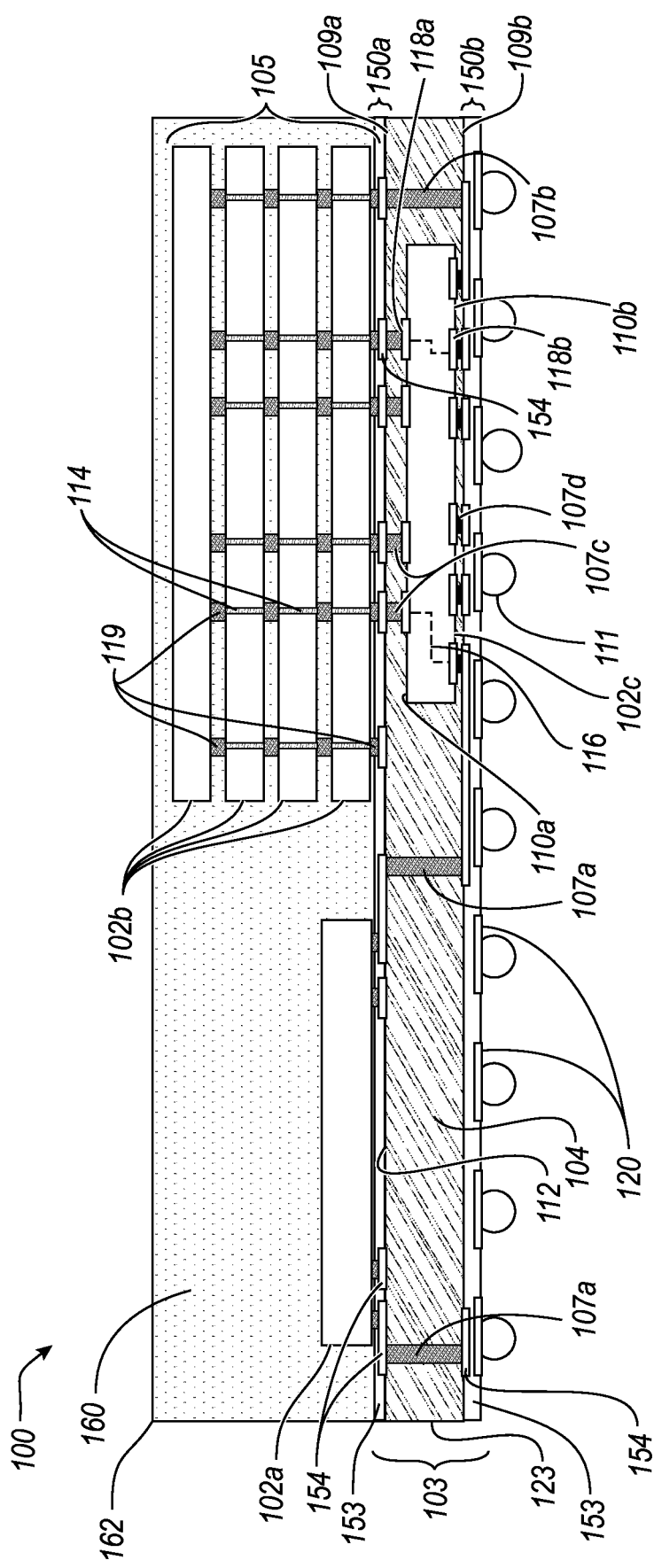
FIG. 1 is a cross-sectional view of a semiconductor device assembly configured in accordance with an embodiment of the present technology.

FIG. 1 is a cross-sectional view of a semiconductor device assembly 100 ("assembly 100") configured in accordance with an embodiment of the present technology. The assembly 100 includes a support structure 103, a first semiconductor die 102a (e.g., a logic die) coupled to the support structure 103, and a plurality of second semiconductor dies 102b (e.g., memory dies) arranged in a stack 105 ("die stack 105") that are separately coupled to the support structure 103 on the same side as the first die 102a. The support structure 103 includes a first molded material 104 (e.g., an encapsulant) defining a support substrate 123. The support substrate 123 has a first side 109a, a second side 109b opposite the first side 109a, and a mounting surface 112 at the first side 109a. The assembly 100 further includes a plurality of conductive contacts 120 (e.g., package contacts) at the second side 109b of the support substrate 123, and a second mold material 160 (e.g., an encapsulant). The second mold material 160 forms a casing 162 over the first side 109a of the support substrate 123 and encases the first die 102a and the die stack 105 of second dies 102b. The casing 162 can be configured to provide mechanical support and shield the dies 102a-b from the ambient environment (e.g., from humidity). The casing 162 also maintains electrical isolation between wire bonds. In some embodiments, the second mold material 160 of the casing 162 can be the same as or substantially similar to the first mold material 104 of the support substrate 123. In other embodiments, the first mold material 104 and second mold material 160 can be different.

The support structure 103 further includes first and second redistribution networks 150a and 150b at opposite sides of the support substrate 123, and a plurality of interconnects 107 (identified individually as first through fourth interconnects 107a-d; collectively "interconnects 107"). The interconnects 107 can be through-silicon vias (TSVs), extending at least partially into the first molded material 104 from the first and/or second sides 109a and 109b of the support substrate 123. The first redistribution network 150a is formed on the first side 109a of the support substrate 123 and operably couples the first die 102a with the die stack 105. The second redistribution network 150b is formed on the second side 109b of the support substrate 123 and is operably coupled to the package contacts 120. The first and second redistribution networks 150a and 150b can each include a passivation material 153 and conductive features 154 (e.g., contact pads and/or traces) embedded in the passivation material 153 and electrically coupled to corresponding interconnects 107. The first and second redistribution networks 150a and 150b can also include other traces and/or vias (not shown) formed in the passivation material that electrically couples conductive features 154 to package contacts 120. The individual first interconnects 107a and second interconnects 107b can electrically connect the package contacts 120 to the first die 102a and the die stack 105, respectively. The package contacts 120 can electrically couple the interconnects 107 to external circuitry (not shown) via electrical connectors 111 (e.g., bump bonds).

The interconnects 107 can be formed from various types of conductive materials (e.g., metallic materials), such as copper, nickel, aluminum, etc. In some embodiments, the conductive materials can include solder (e.g., SnAg-based solder), conductor-filled epoxy, and/or other electrically conductive materials. The second dies 102b of the die stack 105 can include conductive features 114, such as TSVs 114, that extend through the individual second dies 102b. In some embodiments, the TSVs 114 can be at least generally similar in structure and composition to the interconnects 107. The TSVs 114 can be coupled to one another and to the support structure 103 by a plurality of electrically conductive elements 119 (e.g., copper pillars, solder bumps, and/or other conductive features). In some embodiments, the conductive elements 119 can include other types of materials or structures, such as a conductive paste.

As further shown in FIG. 1, the assembly 100 includes a third semiconductor die, or intermediary die 102c, encapsulated by the first molded material 104. The intermediary die 102c includes a first side 110a, a second side 110b opposite the first side 110a, and a plurality of die contacts 118a and 118b (collectively, die contacts 118) at the first side 110a and/or second side 110b of intermediary die 102c. In the illustrated embodiment, the individual third interconnects 107c are electrically coupled to die contacts 118a of the first side 110a of the intermediary die 102c. Individual fourth interconnects 107d are electrically coupled to die contacts 118b of the second side Hob of the intermediary die 102c. The intermediary die 102c can also include electrical features 116 (shown schematically), electrically coupling die contacts 118a on the first side 110a to die contacts 118b on the second side 110b of the intermediary die 102c.

In various embodiments, forming the support substrate 123 from a molded material 104 and encapsulating the intermediary die 102c within the molded material 104 of the support substrate 123 can reduce the overall size of the assembly 100 or semiconductor device package. This is because the intermediary die 102c does not occupy available surface area on the first side 109a of the support substrate 123. Encapsulating the intermediary die 102c within the molded material 104 of the support substrate 123 also protects the intermediary die 102c from physical damage that may occur in downstream manufacturing steps. For example, if the intermediary die 102c was mounted on an exterior surface of the support substrate 123 instead of being embedded within the support substrate 123, the intermediary die 102c could be exposed to physical damage that may result from stacking the first die 102a and/or second die 102b on the intermediary die 102c. Die assemblies configured in accordance with various embodiments of the present technology can address these and other limitations of conventional stacked die assemblies.

The individual semiconductor dies 102a-c can each be formed from a semiconductor substrate, such as silicon, silicon-on-insulator, compound semiconductor (e.g., Gallium Nitride), or other suitable substrates. The semiconductor substrate can be cut or singulated into semiconductor dies having any of variety of integrated circuit components or functional features, such as dynamic random-access memory (DRAM), static random-access memory (SRAM), flash memory, other forms of integrated circuit devices, including memory, processing circuits, imaging components, and/or other semiconductor devices. In selected embodiments, the assembly 100 can be configured as a hybrid memory cube (HMC) in which the die stack 105 provides data storage (e.g., DRAM control) within the HMC. In some embodiments, the assembly 100 can include other semiconductor dies in addition to and/or in lieu of one or more of the individual semiconductor dies 102a-c. For example, such dies can include integrated circuit components other than data storage, interface, and/or memory control components. Further, although the assembly 100 shown in FIG. 1 includes only one logic die on the support structure 103, in other embodiments, the assembly 100 can include multiple logic dies (e.g., two dies, four dies, etc.). Similarly, the assembly 100 can include more than four memory dies (e.g., six dies, eight dies, 10 dies, etc.) or less than three memory dies (e.g. one die). For example, in one embodiment, the assembly 100 can include two logic dies and six memory dies 102b, both mounted to the first side 109a of the support structure 103. Similarly, the assembly 100 can include more than one interface die (e.g., two dies, three dies, etc.). Also, in various embodiments, the semiconductor dies can have different sizes. For example, in some embodiments, the semiconductor dies can have the same or different footprints.

Figure 2G:
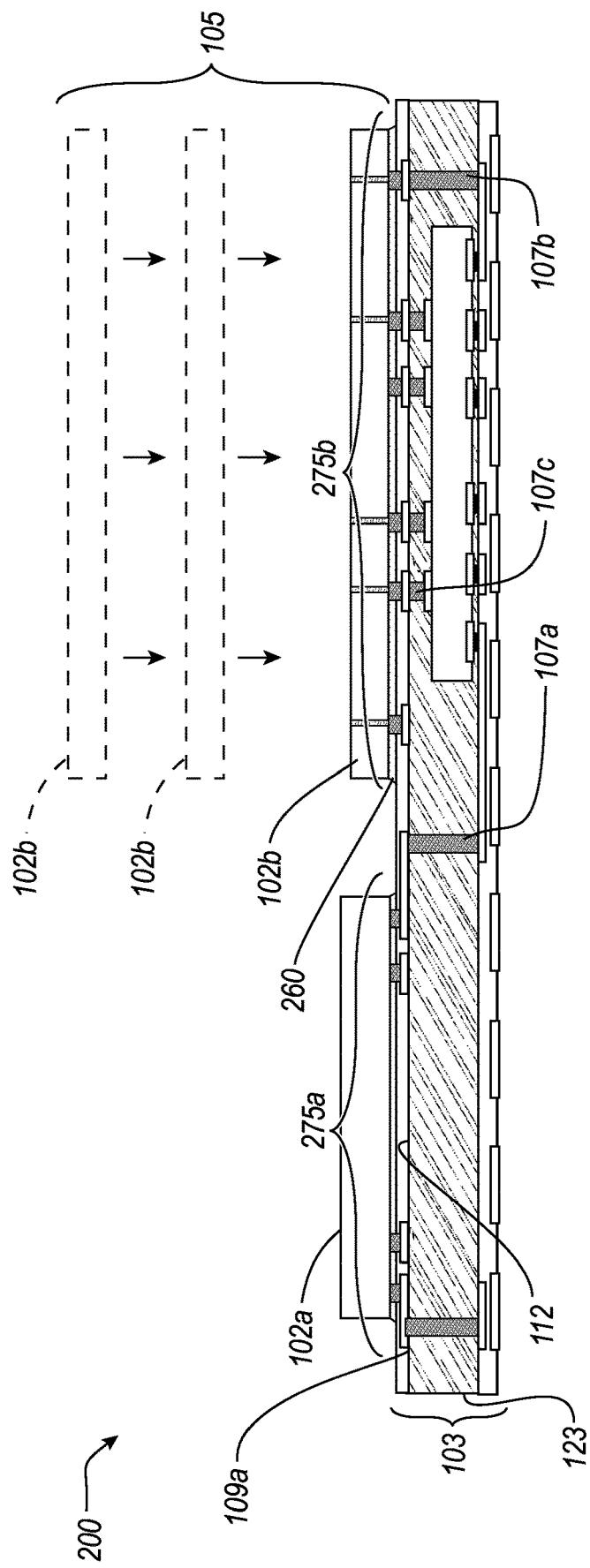

FIGS. 2A-2G are cross-sectional views illustrating a semiconductor device assembly 200 ("assembly 200") at various stages of manufacturing a semiconductor device assembly in accordance with embodiments of the present technology. Referring to FIG. 2A, the assembly 200 includes a carrier substrate 251 having a front side 251a and back side 251b, wherein a die-attach material 240 (e.g., a die-attach tape) is formed on the front side 251a of the carrier substrate 251. The die-attach material 240 attaches the fourth interconnects 107d of the intermediary die 102c to the carrier substrate 251 and allows easy removal of the carrier substrate 251 from the intermediary die 102c in later processing steps. The carrier substrate 251 can be a temporary carrier formed from, e.g., silicon, silicon-on-insulator, compound semiconductor (e.g., Gallium Nitride), or other suitable substrate materials. In part, the carrier substrate 251 protects a surface of the die-attach material 240 during the downstream processing steps to ensure the die-attach material 240 can be later properly removed from the intermediary die 102c. In these and other embodiments, die-attach material 240 can include an over wire material or a laminate film (e.g., a laminate film of epoxy-based material). The die-attach material can include, for example, a die-attach or a dicing-die attach film (known to those skilled in the art as "DAB" or "DFFs," respectively). In one embodiment the die-attach material 240 and/or film-over wire materials can each include DAFs or DDFs provided by Henkel AG & Co. of Shanghai, China (e.g., Model Nos. Ablestick ATB-100, 100U, 100A).

FIG. 2B shows the assembly 200 after molded material 104 has been deposited on assembly 200 to form the support substrate 123. The molded material 104 encapsulates the intermediary die 102c such that the intermediary die 102c is sealed within the mold material 104. The mold material 104 may be formed from a resin, epoxy resin, silicone-based material, polyimide and/or other suitable resin used or known in the art. Once deposited, the molded material 104 can be cured by UV light, chemical hardeners, heat or other suitable curing methods known in the art. The cured mold material 104 can include a first mounting region 275a and a second mounting region 275b arranged laterally with respect to each other along the cured molded material 104. The individual first and second dies 102a and 102b are attached to the first and second mounting regions 275a-b, respectively, in subsequent steps.

FIG. 2C shows the assembly 200 after additional interconnects 107a-c are formed in the mold material 104. In some embodiments, the interconnects 107 can include a dielectric liner (not shown), barrier layer (not shown), and a conductive fill material 209 deposited in openings 242 formed in the molded material 104. The openings 242 can be formed, for example, using etching, laser drilling, or other suitable techniques. The fill material 209 can include, for example, copper, nickel, silver, gold, solder, conductive polymer, or other suitable materials or alloys of materials having desired conductivity. The third interconnects 107c are generally aligned with and electrically coupled to die contacts 110 on the first side 110a of intermediary die 102c.

FIG. 2D shows the assembly 200 after the first redistribution network 150a is formed on the first side 109a of the support substrate 123. The first redistribution network 150a can include contact pads 154. The plurality of contact pads 154 can vary in size and individual contact pads 154 can be electrically coupled to a corresponding interconnect 107. In some embodiments, some of the contact pads 154 are not generally aligned with an interconnect 107 to provide additional electrical pathways distinct from those provided by interconnects 107. Notably, the first redistribution network 150a protects the support substrate 123 from downstream processing steps and is thus deposited before the substrate 251 is removed from the support substrate 123 and the intermediary die 102c.

FIG. 2E illustrates the assembly 200 after the carrier substrate 251 and die attach material 240 (FIG. 2D) have been removed, which can be done using a vacuum, poker pin, or other suitable methods known in the art. The carrier substrate 251 and die attach material 240 can also be removed by thinning the assembly 200 (e.g., backgrinding, dry etching processes, chemical etching processes, chemical mechanical polishing (CMP), etc.). Removing the carrier substrate 251 and die attach material 240 exposes the second side 109b of the support substrate 123.

Referring next to FIG. 2F, the second redistribution network 150b is formed on the second side 109b of support substrate 123. The second redistribution network 150b includes the plurality of package contacts 120 and contact pads 154. The first redistribution network 150a and second redistribution network 150b formed around the support substrate 123 protect the mold material 104 and intermediary die 102c embedded within the mold material 104. The passivation material 153 of the first redistribution network 150a and second redistribution network 150b may be formed from parylene, low temperature chemical vapor deposition (CVD) materials, such as tetraethylorthosilicate (TEOS), silicon nitride ($Si_3Ni_4$), silicon oxide ($SiO_2$), and/or other suitable dielectric, non-conductive materials. Although the first redistribution network 150a and second redistribution network 150b can create a stronger mechanical connection between the semiconductor dies mounted thereto and the support substrate 123, in some embodiments, the first redistribution network 150a and second redistribution network 150b are configured differently. For example, in some embodiments, the first redistribution network 150a may not be present.

FIG. 2G illustrates the assembly 200 after the first die 102a and second die 102b have been mounted to the mounting surface 112 on the first side 109a of the support substrate 123. In some embodiments, the first die 102a is mounted to the first mounting region 275a, the second die 102b is mounted to the second mounting region 275b, and the intermediary die 102c is embedded within the support substrate 123 under the second mounting region 275b. The intermediary die 102c is accordingly located at least in part below the die stack 105 and/or the second die 102b. In such a configuration, the intermediary die 102c is considered to be generally aligned with the die stack 105, and more specifically the intermediary die 102c can be superimposed under the die stack 105. The intermediary die 102c may also be located elsewhere in the support substrate 123 in other configurations. For example, the intermediary die 102c may be embedded within the first mounting region 275a and be located at least in part below the first die 102a.

As further shown in FIG. 2G, the assembly 200 can include a dielectric underfill material 260 to attach both the first die 102a and second die 102b to the support substrate 123. The underfill material 260 can be deposited or otherwise formed around and/or between some or all of the dies of the assembly 200 to enhance the mechanical connection between the dies and support structure 103. The underfill material 260 can also provide electrical isolation between the interconnects 107 or other conductive structures between the dies. The underfill material 260 can be a non-conductive epoxy paste (e.g., XS8448-171 manufactured by Namics Corporation of Niigata, Japan), a capillary underfill, a non-conductive film, a molded underfill, and/or include other suitable electrically-insulative materials. In several embodiments, the underfill material 260 is not necessary to form a sufficient mechanical connection between the dies and may be omitted.

Figure 3:
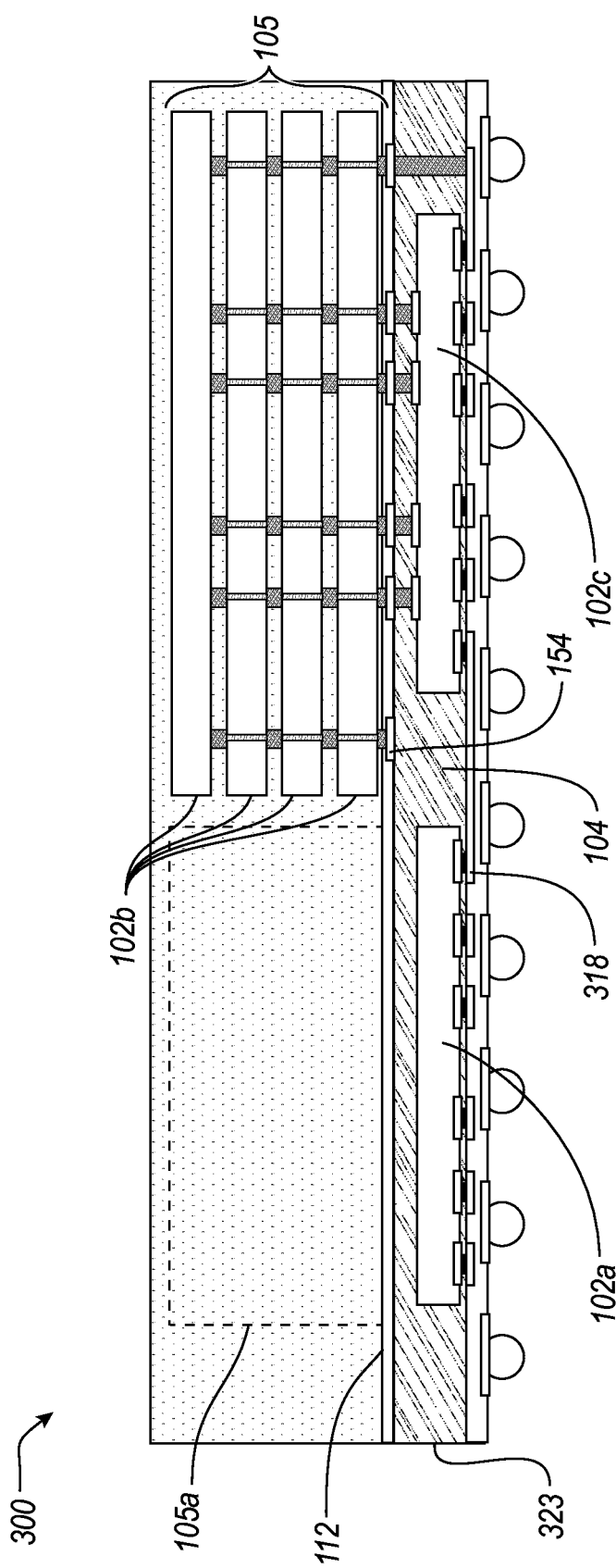
FIGS. 3-5 are cross-sectional views of semiconductor device assemblies configured in accordance with additional embodiments of the present technology.

FIG. 3 is a cross-sectional view of a semiconductor device assembly 300 ("assembly 300") configured in accordance with another embodiment of the present technology. The assembly 300 can include features generally similar to those of the assemblies described in detail above. In the illustrated embodiment of FIG. 3, the assembly 300 includes a support substrate 323, first die 102a, intermediary die 102c, and die stack 105 of second dies 102b. The support substrate 323 can include functional features generally similar to those of support substrate 123, as described above. In this embodiment, the support substrate 323 includes the first die 102a and the intermediary die 102c encapsulated within the mold material 104. In some embodiments, additional semiconductor die (not shown) can be mounted on the mounting surface 112 of the support substrate 323 above the first die 102a. For example, a second die stack 105a (shown as dashed lines) can be mounted to the support substrate 323 above the embedded first die 102a.

Figure 4:
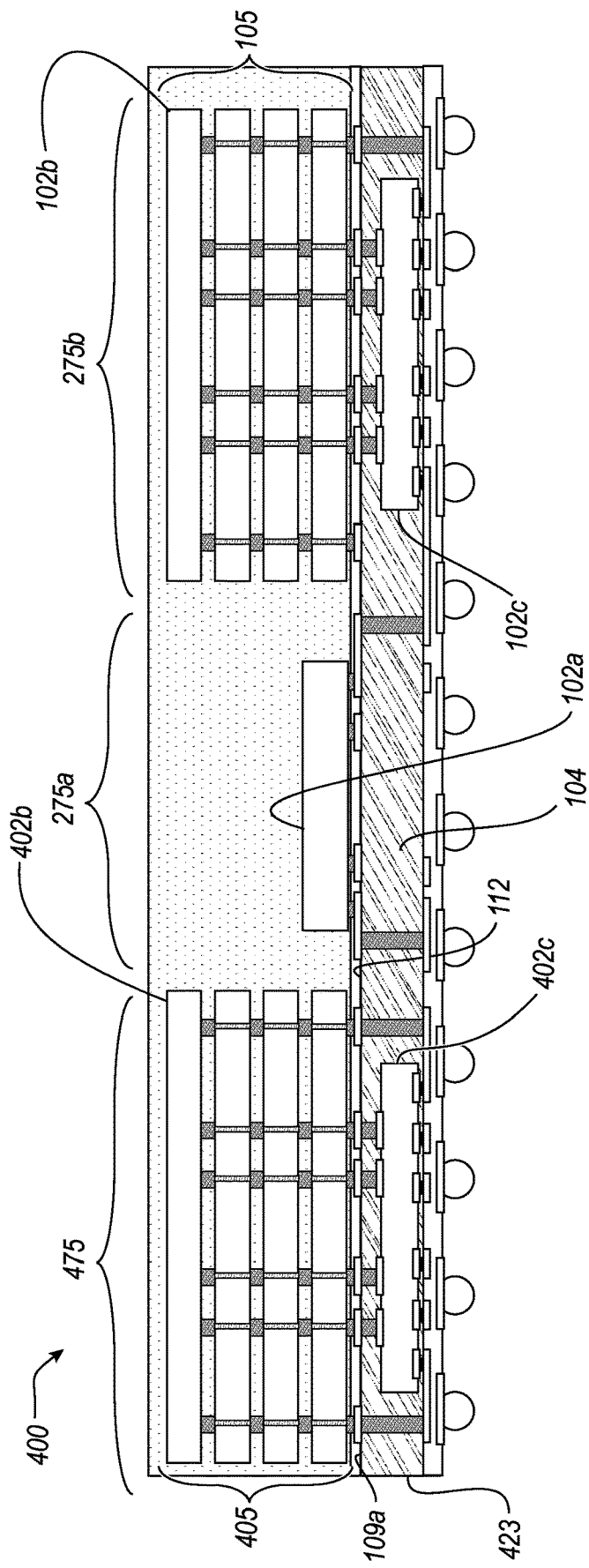

FIG. 4 is a cross-sectional view of a semiconductor device assembly 400 ("assembly 400") configured in accordance with another embodiment of the present technology. The assembly 400 can include features generally similar to those of the assemblies described in detail above. In the illustrated embodiment of FIG. 4, the assembly 400 includes a support substrate 423, a plurality of fourth semiconductor dies 402b (e.g., memory dies) arranged in a second die stack 405, a fifth semiconductor die 402c (e.g., a second intermediary die), and a third mounting region 475. The first mounting region 275a of the assembly 400 is between the second mounting region 275b and third mounting region 475. The support substrate 423 can include functional features generally similar to those of support substrate 123, as described above. The fourth die 402b and/or second die stack 405 is mounted to the third mounting region 475 of the support substrate 423 and the fifth die 402c is encapsulated by the mold material 104 within the third mounting region 475. The fifth die 402c is accordingly located at least in part below second die stack 405. In such a configuration, the fifth die 402c and second die stack 405 are considered to be generally aligned. As shown in FIG. 4, both of the die stacks 105 and 405 and the intermediary dies 102c and 402c are mounted to the mounting surface 112 at the first side 109a of the support substrate 123 with the first die 102a being mounted between die stacks 105 and 405.

In other embodiments, the assembly 400 can be configured differently. For example, the first die 102a, may not be located between the die stacks 105 and 405. Additionally, although both of the die stacks 105 and 405 shown in FIG. 4 each contain the same number of stacked dies, the die stacks 105 and 405 may contain a different number of dies (i.e. memory dies). For example, die stack 105 may contain three memory dies 102b while die stack 405 may contain six memory dies 402b, or vice versa. Additionally, other embodiments of assembly 400 may include more than two die stacks and more than two dies (i.e., intermediary dies) encapsulated by the mold material 104. For example, the assembly 400 may include three die stacks and three intermediary dies wherein each of the intermediary dies is encapsulated by the mold material 104 and is considered to be generally aligned with each of the corresponding die stacks. Moreover, the first and second dies 102b and 402b can be the same type or different type of dies.

Figure 5:
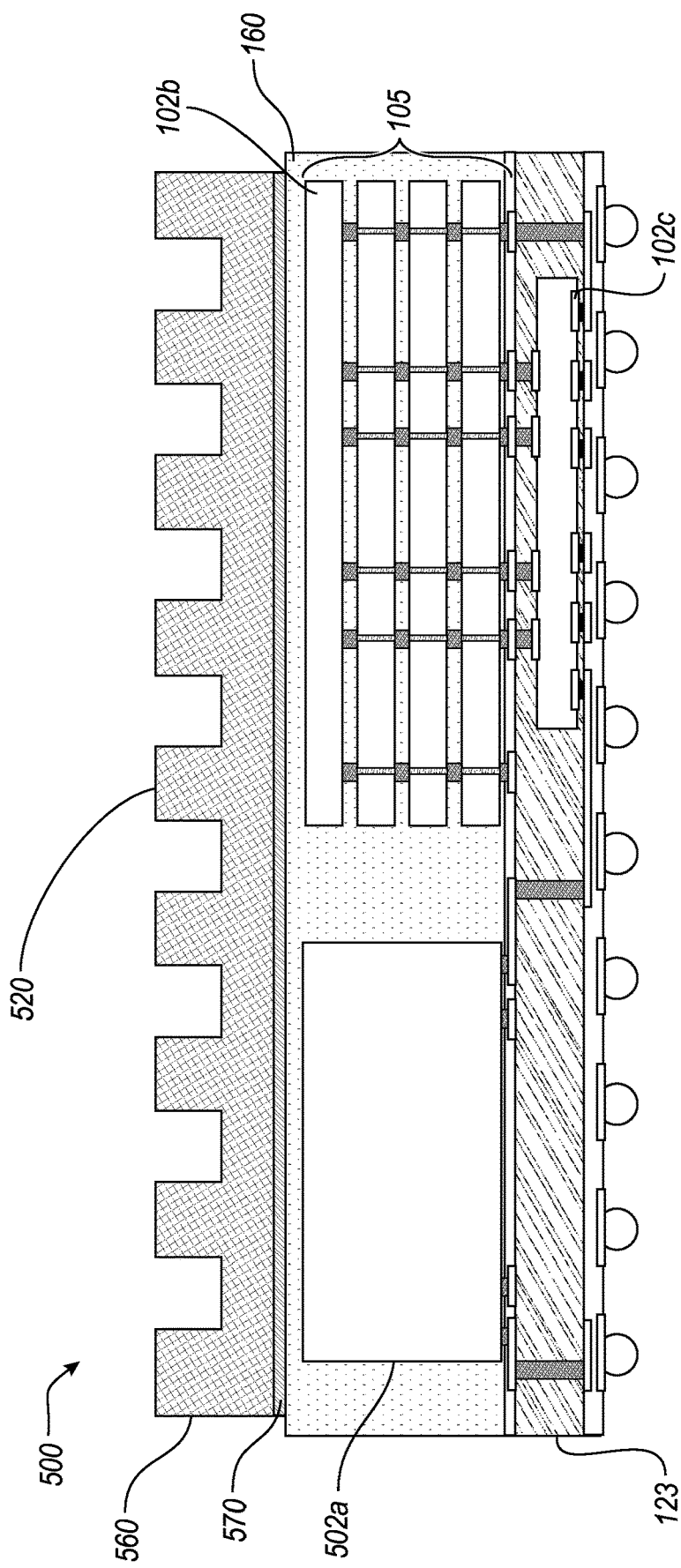

FIG. 5 is a cross-sectional view of a semiconductor device assembly 500 ("assembly 500") configured in accordance with another embodiment of the present technology. The assembly 500 can include features generally similar to the assemblies described in detail above. In the illustrated embodiment of FIG. 5, the assembly 500 includes a first die 502a (e.g., a logic die) and die stack 105, wherein the first die 502a and the die stack 105 are mounted to the support substrate 123 and encapsulated within the second mold material 160. The logic die 502a can have functional features generally similar to those of first die 102a, as described above. A thicker logic die 502a can have benefits over a thinner logic die including, for example, more memory control (e.g., DRAM control) and more efficient heat flow through the assembly 500.

The illustrated embodiment of FIG. 5 also includes a first interface material 570 and a heat sink 560 attached to the first interface material 570 to help dissipate heat generated from the individual dies 502a, 102b and 102c. The heat sink 560 can include a metal structure with an array of comb protrusions 520 to increase the surface area of the heat sink 560 and the rate of heat dissipation from the assembly 500. The heat sink may be formed from aluminum, copper or other suitable materials with similar thermal conductivity properties. In other embodiments, a fan (not shown) or other active cooler may be used to increase the rate of airflow over the heat sink 560.

In some embodiments, the first interface material 570 can be made from what are known in the art as "thermal interface materials" or "TIMs", which are designed to increase the thermal contact conductance at surface junctions (e.g., between a die surface and a heat spreader). TIMs can include resins, silicone-based greases, gels, or adhesives that are doped with conductive materials (e.g., carbon nanotubes, solder materials, diamond-like carbon (DLC), etc.), as well as phase-change materials. In some embodiments, for example, the thermal interface materials can be made from X-23-7772-4 TIM manufactured by Shin-Etsu MicroSi, Inc. of Phoenix, Ariz., which has a thermal conductivity of about 3-4 W/m° K. In other embodiments, the first interface material 640 can include other suitable materials, such as metals (e.g., copper) and/or other suitable thermally conductive materials.

Figure 6:
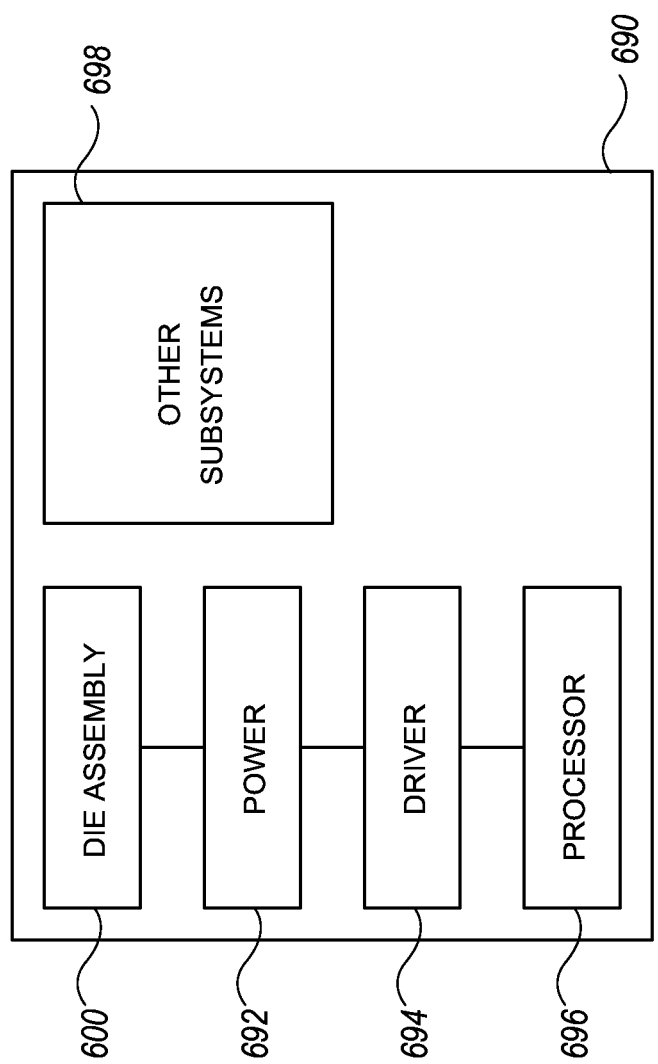
FIG. 6 is a schematic view of a system that includes a semiconductor die assembly configured in accordance with an embodiment of the present technology.

Any one of the stacked semiconductor devices described above with reference to FIGS. 1-5 can be incorporated into any of a myriad of larger and/or more complex systems, a representative example of which is system 690 shown schematically in FIG. 6. The system 690 can include a semiconductor die assembly 600, a power source 692, a driver 694, a processor 696, and/or other subsystems or components 698. The semiconductor die assembly 600 can include features generally similar to those of the stacked semiconductor devices described above. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, and appliances. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the technology have been described herein for purposes of illustration, but that various modifications may be made without deviating from the disclosure. For example, although some of the embodiments of the semiconductor devices are described with respect to HMCs, in other embodiments the semiconductor devices can be configured as other memory devices or other types of stacked die assemblies. Certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:
1. A semiconductor device assembly, comprising:
a support substrate including a first side and a second side generally opposite the first side;
a first semiconductor die embedded within the support substrate such that each side of the first semiconductor die is substantially encapsulated by the support sub- strate, the first semiconductor die being configured to route signals across the first and second sides of the support substrate;
a second semiconductor die at the first side of the support substrate;
a die stack at the first side of the support substrate and spaced apart from the second semiconductor die, the die stack including at least a third semiconductor die and a fourth semiconductor die stacked on the third semiconductor die; and
a plurality of conductive contacts at the second side of the support substrate, wherein a portion of the conductive contacts are electrically coupled to at least one of the first, second or third semiconductor dies through the first semiconductor die.

2. The semiconductor device assembly of claim 1 wherein the support substrate comprises a first mold material, and wherein the semiconductor device assembly further comprises a second mold material disposed over the first side of the support substrate and encapsulating the second and third semiconductor dies.

3. The semiconductor device assembly of claim 2, wherein the second mold material encapsulates the fourth semiconductor die stacked on the third semiconductor die.

4. The semiconductor device assembly of claim 1, further comprising a plurality of interconnects extending at least partially through the support substrate, wherein the plurality of interconnects includes:
one or more first interconnects extending from the first side of the support substrate to at least the second side of the support substrate;
one or more second interconnects extending from the first side of the support substrate and electrically coupled to the first semiconductor die;
one or more third interconnects extending from the second side of the support substrate and electrically coupled to the first semiconductor die.

5. The semiconductor device assembly of claim 1 wherein the support substrate comprises a molded material, and wherein the first semiconductor die has a backside, an active side opposite the backside, and a sidewall between the active side and the backside, and wherein the backside, active side and the sidewall are fully encapsulated within the molded material.

6. The semiconductor device assembly of claim 1, further comprising a redistribution network on the first side of the support substrate and extending between the support substrate and at least one of the second and third semiconductor dies, wherein the redistribution network is:
coupled to a combination of the first semiconductor die, the second semiconductor die and the die stack; and
located above the first semiconductor die and below the second semiconductor die and the die stack.

7. The semiconductor device assembly of claim 1 wherein the first semiconductor die includes a communication component, the second semiconductor die includes a memory controller, and the third semiconductor die includes a memory circuit.

8. The semiconductor device assembly of claim 1 wherein the support substrate further comprises a first mounting region and a second mounting region spaced apart from the first mounting region, and wherein:
the second semiconductor die is mounted to the first mounting region;
the third semiconductor die is mounted to the second mounting region; and
the first semiconductor die is below the second mounting region.

9. The semiconductor device assembly of claim 1 wherein the support substrate is formed from an epoxy resin.

10. A semiconductor device assembly, comprising:
a support structure including (1) mold material, (2) a mounting surface defined by the mold material, and (3) a redistribution network configured to route signals at least along a lateral plane;
a stack of memory dies attached to the mounting surface and over the redistribution network, the stack of memory dies electrically connected to the redistribution network;
a logic die attached over the redistribution network and electrically coupled to the stack of memory dies through the redistribution network; and
an intermediary die encapsulated by the mold material and electrically coupled to at least one of the logic die or the stack of memory dies through the redistribution network, the intermediary die being configured to route a signal along both vertical and lateral directions between the redistribution network and an opposing surface of the support structure.

11. The semiconductor device assembly of claim 10 wherein the intermediary die has a backside, an active side opposite the backside, and a sidewall between the active side and the backside, and wherein the backside, active side and sidewall are fully encapsulated within the mold material.

12. The semiconductor device assembly of claim 10 wherein the logic die is mounted to the mounting surface and encapsulated by the mold material.

13. The semiconductor device assembly of claim 10, further comprising a plurality of conductive contacts and one or more interconnects extending at least partially through the mold material, wherein the conductive contacts are electrically coupled to at least one of the stack of memory dies, logic die, or intermediary die via the one or more of the interconnects.

14. The semiconductor device assembly of claim 10 wherein the redistribution network is a first redistribution network that extends over a first side of the mold material, and the semiconductor device assembly further comprises a second redistribution network extending over a second side of the mold material.

15. The semiconductor device assembly of claim 14 wherein the second redistribution network includes one or more conductive contacts electrically coupled to the intermediary die.

16. The semiconductor device assembly of claim 10 wherein the mold material is an epoxy resin.

17. The semiconductor device assembly of claim 10 wherein the logic die is at least partially encapsulated by the mold material.

18. The semiconductor device assembly of claim 10 wherein the logic die includes a controller and the stack of memory dies includes a memory circuit.

19. The semiconductor device assembly of claim 10 wherein the mounting surface includes a first region and a second region spaced apart from the first region, wherein the logic die is disposed within the first region, the stack of memory dies is disposed within the second region, and the intermediary die is disposed below the second region.

20. The semiconductor device assembly of claim 10 wherein the mold material is a first mold material, the semiconductor device further comprising a second mold material encapsulating at least a portion of the logic die and the stack of memory dies.

\* \* \* \* \*